United States Patent
Lei et al.

(10) Patent No.: US 8,389,397 B2
(45) Date of Patent: Mar. 5, 2013

(54) METHOD FOR REDUCING UBM UNDERCUT IN METAL BUMP STRUCTURES

(75) Inventors: Yi-Yang Lei, Wuqi Township (TW); Hung-Jui Kuo, Hsin-Chu (TW); Chung-Shi Liu, Shin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 276 days.

(21) Appl. No.: 12/881,495

(22) Filed: Sep. 14, 2010

(65) Prior Publication Data
US 2012/0064712 A1    Mar. 15, 2012

(51) Int. Cl.
 *H01L 21/44* (2006.01)
(52) U.S. Cl. .................. 438/614; 257/E21.508
(58) Field of Classification Search .................. 438/615, 438/616, 739, 751
See application file for complete search history.

(56) References Cited

U.S. PATENT DOCUMENTS

| | | | | |
|---|---|---|---|---|
| 5,508,229 A | * | 4/1996 | Baker ........................... | 438/614 |
| 5,656,858 A | * | 8/1997 | Kondo et al. ................. | 257/737 |
| 7,064,436 B2 | * | 6/2006 | Ishiguri et al. ............... | 257/738 |

* cited by examiner

*Primary Examiner* — Chandra Chaudhari
(74) *Attorney, Agent, or Firm* — Slater & Matsil, L.L.P.

(57) ABSTRACT

A method of forming a device includes providing a wafer including a substrate; and forming an under-bump metallurgy (UBM) layer including a barrier layer overlying the substrate and a seed layer overlying the barrier layer. A metal bump is formed directly over a first portion of the UBM layer, wherein a second portion of the UBM layer is not covered by the metal bump. The second portion of the UBM layer includes a seed layer portion and a barrier layer portion. A first etch is performed to remove the seed layer portion, followed by a first rinse step performed on the wafer. A second etch is performed to remove the barrier layer portion, followed by a second rinse step performed on the wafer. At least a first switch time from the first etch to the first rinse step and a second switch time from the second etch to the second rinse step is less than about 1 second.

19 Claims, 7 Drawing Sheets

METHOD FOR REDUCING UBM UNDERCUT IN METAL BUMP STRUCTURES

TECHNICAL FIELD

This disclosure relates generally to integrated circuits, and more particularly to the methods of forming metal bump structures.

BACKGROUND

In the formation of a semiconductor wafer, integrated circuit devices such as transistors are first formed at the surface of a semiconductor substrate. Interconnect structures are then formed over the integrated circuit devices. Metal bumps are formed on the surface of the semiconductor chip, so that the integrated circuit devices can be accessed.

In conventional metal bump formation processes, under-bump metallurgy (UBM) layers are first formed. The UBM layers include a titanium layer and a copper seed layer over the titanium layer. Metal bumps are then formed on UBM layers by plating. Undesired portions of UBM layers are then removed by wet etching. Conventionally, the copper seed layer was removed using ammonical (AM) etching, in which alkaline etchants including $Cu(NH_3)_4Cl_2$, $Cu(NH_3)_2Cl$, $NH_3$, and $NH_4Cl$ are used. The resulting chemicals including CuO are then cleaned using $NH_3$ and water. The exposed portions of the titanium layer are then etched using an HF solution with a high concentration of 11 percent. It was observed that undercuts were formed under the metal bumps due to the lateral etching of the titanium layer, and the undercuts may extend under the metal bumps by as much as about 10 μm. As a result, the metal bumps may delaminate from the respective metal pads, resulting in a low yield in the metal bump formation process.

SUMMARY

In accordance with one aspect, a method of forming a device includes providing a wafer including a substrate; and forming an under-bump metallurgy (UBM) layer including a barrier layer overlying the substrate and a seed layer overlying the barrier layer. A metal bump is formed directly over a first portion of the UBM layer, wherein a second portion of the UBM layer is not covered by the metal bump. The second portion of the UBM layer includes a seed layer portion and a barrier layer portion. A first etch is performed to remove the seed layer portion, followed by a first rinse step performed on the wafer. A second etch is performed to remove the barrier layer portion, followed by a second rinse step performed on the wafer. At least a first switch time from the first etch to the first rinse step and a second switch time from the second etch to the second rinse step is less than about 1 second.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method for forming metal bumps with reduced undercuts in the underlying under-bump metallurgies (UBMs) is provided in accordance with an embodiment. The intermediate stages of manufacturing the embodiment are illustrated. The variations of the embodiment are discussed. Throughout the various views and illustrative embodiments, like reference numbers are used to designate like elements.

Figure 1:
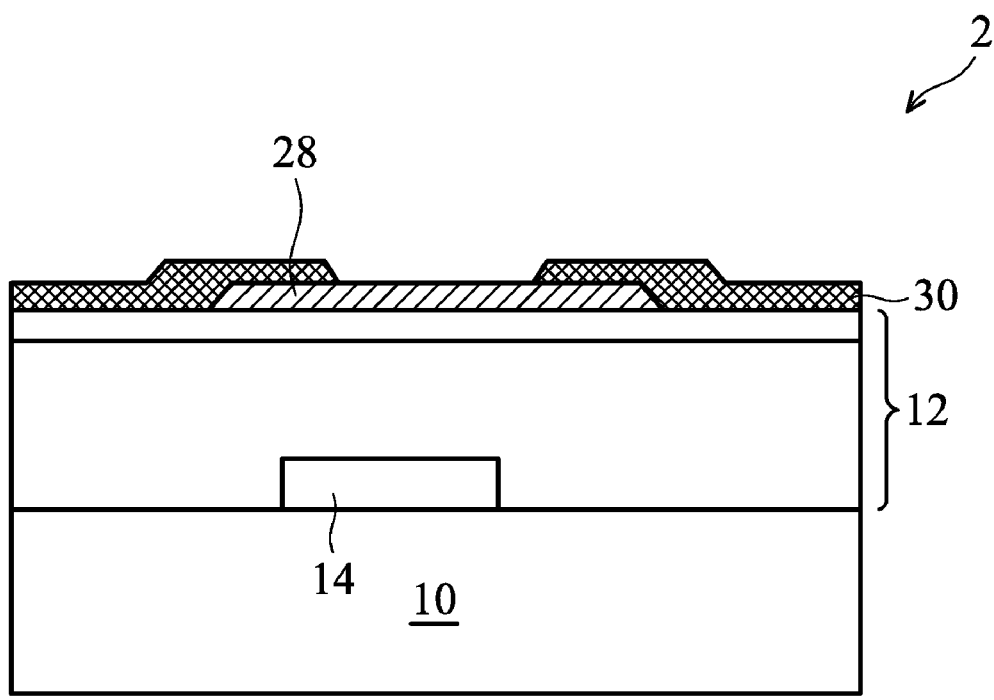
FIGS. 1 through 6 are cross-sectional views of intermediate stages in the manufacturing of a metal bump in accordance with an embodiment.

Referring to FIG. 1, wafer 2, which includes substrate 10, is provided. In an embodiment, substrate 10 is a semiconductor substrate, such as a silicon substrate, although it may include other semiconductor materials, such as silicon germanium, silicon carbide, gallium arsenide, or the like. Semiconductor devices 14, such as transistors, may be formed at the surface of substrate 10. Interconnect structure 12, which includes metal lines and vias (not shown) formed therein and electrically coupled to semiconductor devices 14, is formed over substrate 10. The metal lines and vias may be formed of copper or copper alloys, and may be formed using the well-known damascene processes. Interconnect structure 12 may include an inter-layer dielectric (ILD) and inter-metal dielectrics (IMDs). In alternative embodiments, wafer 2 is an interposer wafer or a wafer of package substrates, and is substantially free from integrated circuit devices including transistors, resistors, capacitors, inductors, and/or the like, formed therein. In these embodiments, substrate 10 may be formed of a semiconductor material or a dielectric material such as silicon oxide.

Metal pad 28 is formed over interconnect structure 12. Metal pad 28 may comprise aluminum (Al), copper (Cu), silver (Ag), gold (Au), nickel (Ni), tungsten (W), alloys thereof, and/or multi-layers thereof. Metal pad 28 may be electrically coupled to semiconductor devices 14, for example, through the underlying interconnect structure 12. Passivation layer 30 may be formed to cover edge portions of metal pad 28. In an exemplary embodiment, passivation layer 30 is formed of polyimide or other known dielectric materials such as silicon oxide, silicon nitride, and multi-layers thereof.

Figure 2:
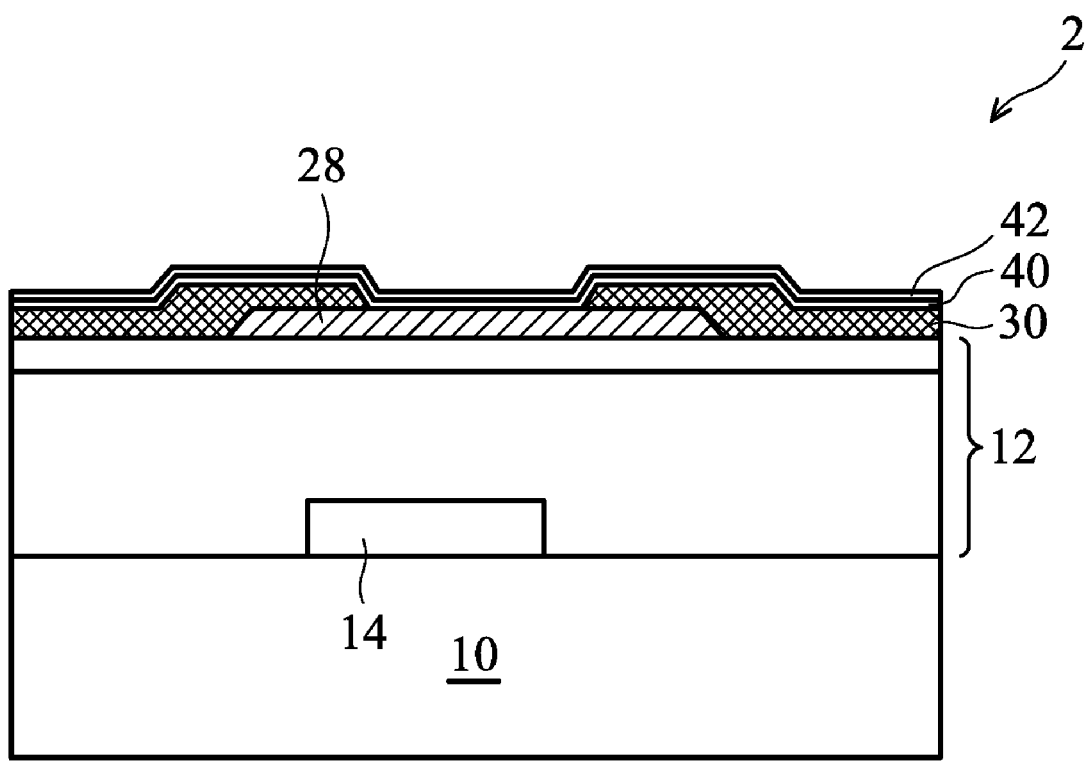

Referring to FIG. 2, an under-bump metallurgy (UBM), which includes barrier layer 40 and seed layer 42, is blanket formed. Barrier layer 40 extends into the opening in passivation layer 30 and contacts metal pad 28. Barrier layer 40 may be a titanium layer, a titanium nitride layer, a tantalum layer, or a tantalum nitride layer. The materials of seed layer 42 may include copper or copper alloys, and hence seed layer 42 is alternatively referred to as a copper seed layer hereinafter. However, other metals, such as silver, gold, aluminum, and combinations thereof, may also be included. In an embodiment, barrier layer 40 and seed layer 42 are formed using physical vapor deposition or other applicable methods. Barrier layer 40 may have a thickness between about 500 Å and about 2,000 Å. Seed layer 42 may have a thickness between about 1,000 Å and about 10,000 Å, although different thicknesses may be used.

Figure 3:
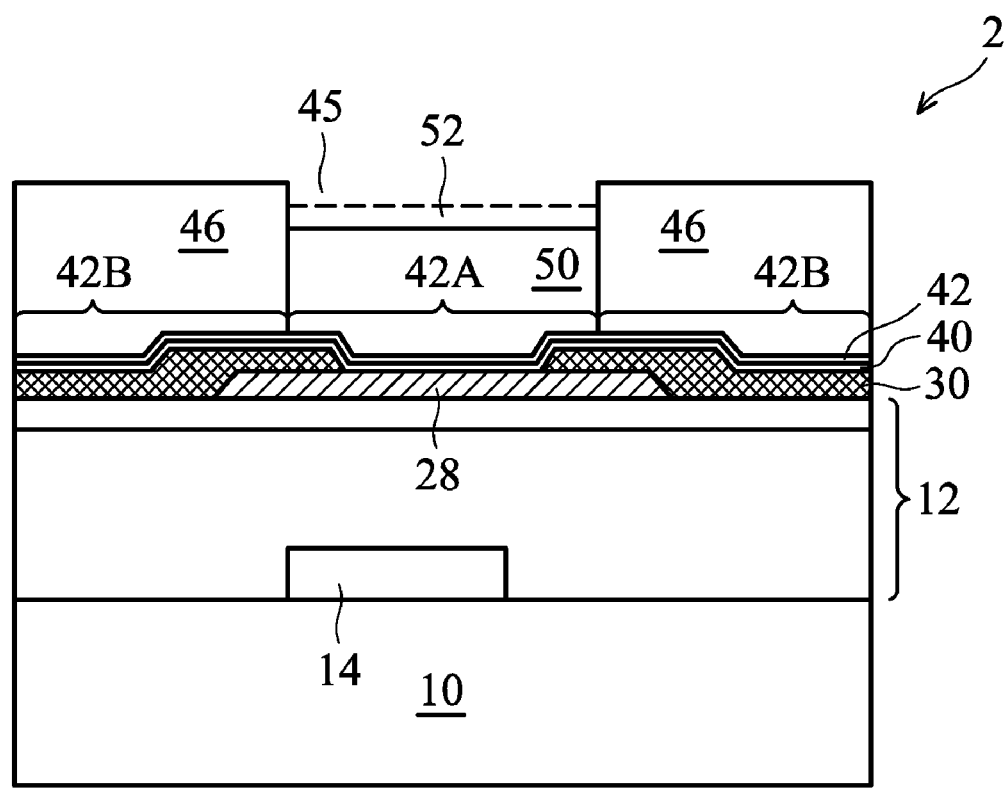

FIG. 3 illustrates the formation of mask 46, which may be formed of a photo resist or a dry film, for example. Mask 46 is patterned, and first portion 42A of seed layer 42 is exposed through opening 45 in mask 46, while second portions 42B of seed layer 42 are covered by mask 46. Next, wafer 2 is placed into a plating solution (not shown), and a plating step is performed to form metal bump 50 on portion 42A of seed layer 42 and in opening 45. The plating may be an electroplating, an electroless-plating, an immersion plating, or the like. In an embodiment, metal bump 50 is a copper bump. In alternative embodiments, metal bump 50 is a solder bump, which may be formed of a Sn—Ag alloy, a Sn—Ag—Cu alloy, or the like, and may be lead-free or lead-containing.

Figure 4:
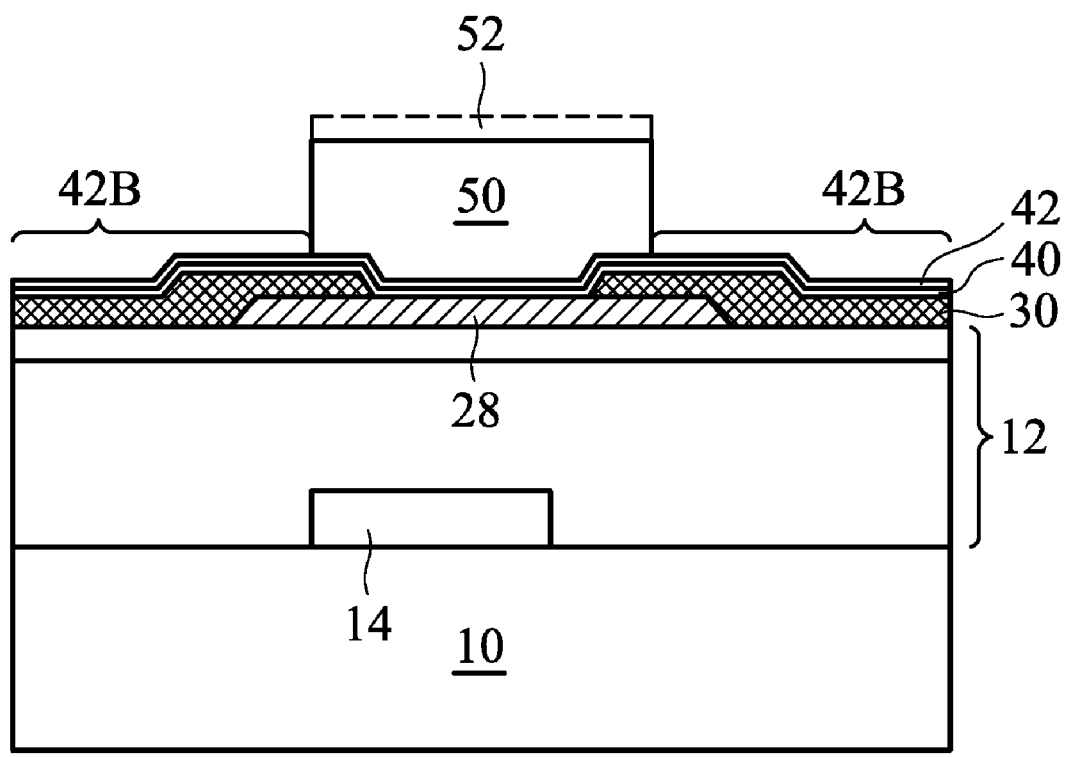

In the embodiment wherein metal bump 50 is a copper bump, additional layers 52 such as a solder cap, a nickel layer, a tin layer, a palladium layer, a gold layer, alloys thereof, and/or multi-layers thereof, may be formed on the surface of metal bump 50. Further, the additional layers may be formed before or after the subsequent removal of mask 46, which removal step is shown in FIG. 4. After the formation of metal bump 50, mask 46 is removed, and the portions of UBM 40/42 previously covered by mask 46 are exposed. The resulting structure is also shown in FIG. 4.

Figure 5:
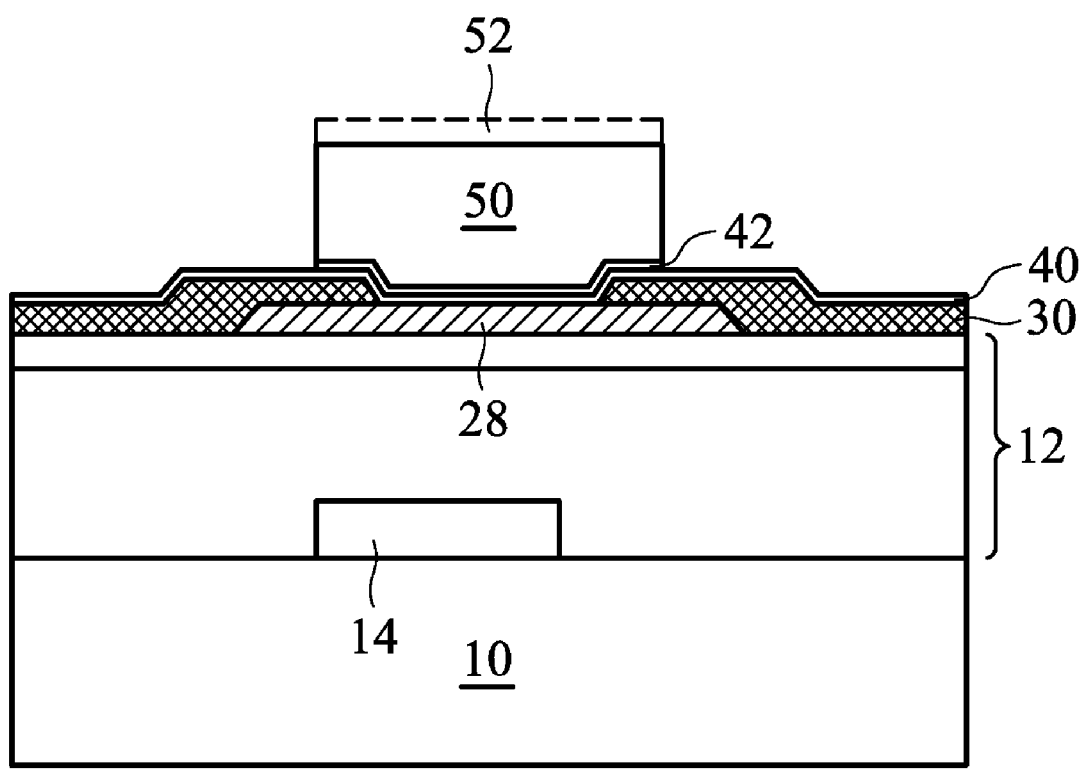
Figure 7:
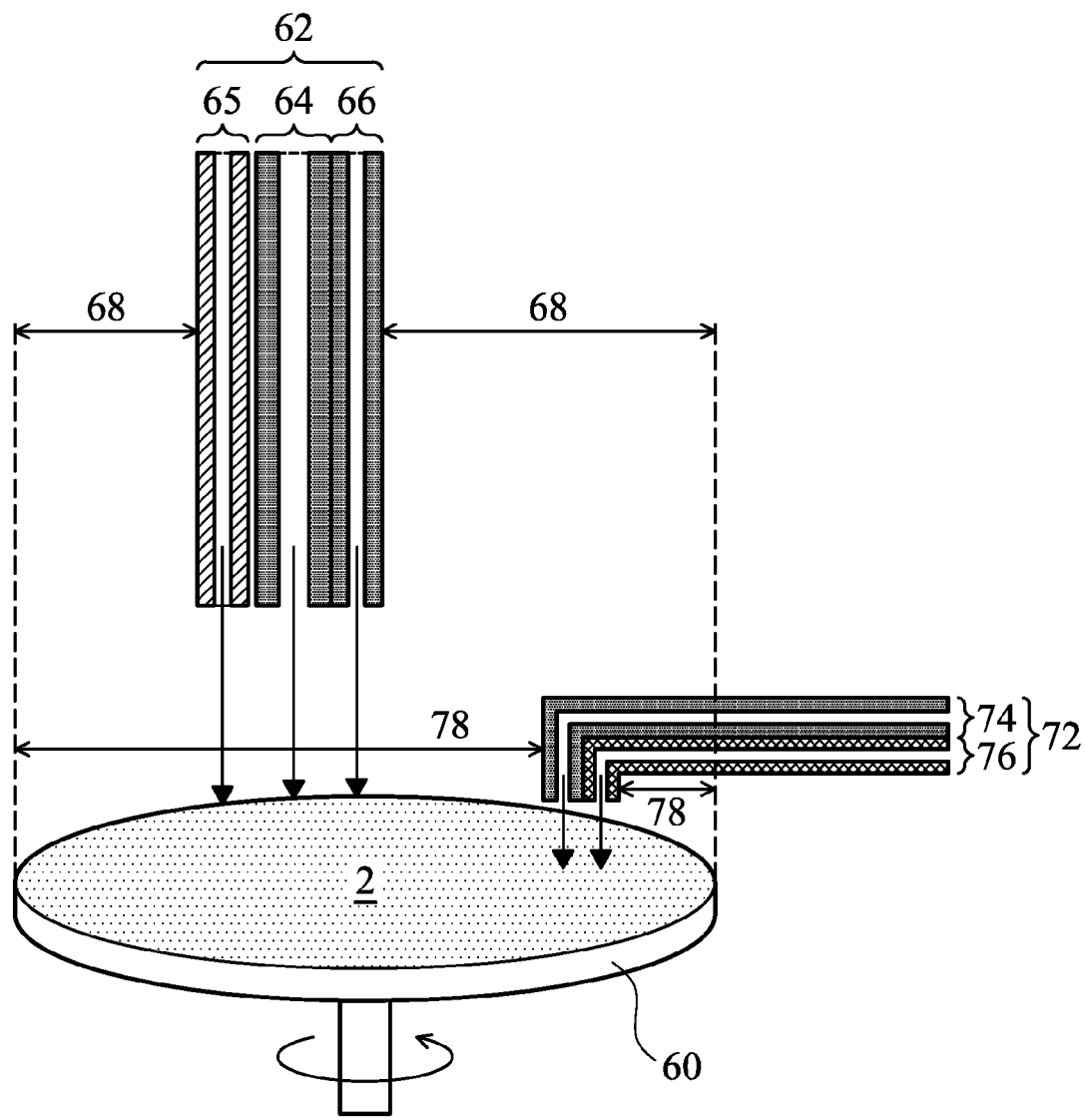
FIG. 7 illustrates an apparatus for etching under-bump metallurgy (UBM).

FIG. 5 illustrates the removal of portions 42B of seed layer 42 using an acidic etching, which is also a wet etch. In an embodiment wherein seed layer 42 is a copper seed layer, the etchant may include diluted phosphoric acid ($H_3PO_4$) and hydrogen peroxide ($H_2O_2$), which are pre-mixed and are in combination referred to as DPP hereinafter. In an exemplary embodiment, the DPP includes between about 0.5 weight percent and about 5 weight percent phosphoric acid, and between about 0.5 weight percent and about 5 weight percent hydrogen peroxide, although different concentrations may be used. FIG. 7 illustrates an exemplary apparatus for etching seed layer 42. Wafer 2 is placed on platform 60, which spins along with the overlying wafer 2 during the etching process. Chemical dispenser 64 and de-ionized (DI) water dispenser 66 are located over wafer 2, and are physically bundled together to form parts of dispenser set 62. Accordingly, dispensers 64 and 66 always move together. During the etching of seed layer 42, dispenser set 62 swings back and forth (as symbolized by arrows 68) so that the DPP may be sprayed through dispenser 64 onto wafer 2 uniformly. The duration of the etching may be between about 30 seconds and about 3 minutes. The reaction may be expressed as:

  [Eq. 1]

And

  [Eq. 2]

The spray of the DPP is then stopped, and the process is switched to a first rinse step, wherein DI water is sprayed onto wafer 2 to rinse wafer 2. The DI water is sprayed using dispenser 66. The switch time, which is the period of time starting from the time the spray of the DPP is ended to the time the spray of DI water is started, is short. In an embodiment, the switch time is less than about 1 second, less than about 0.5 seconds, or even less than about 0.3 seconds. Since dispensers 64 and 66 are bundled in a same dispenser set, the DI water is dispensed to the same location where DPP was dispensed. Further, the short switch time ensures that the chemicals on wafer 2 are quickly removed from over wafer 2. With the quick removal of the resulting chemicals, there is less time for undesirable particles to be deposited on wafer 2, which particles, such as tin particles, are in the chemicals due to the etching of solder. In an exemplary embodiment, during the first rinse step, wafer 2 keeps on spinning with a high-low-high rotation-speed pattern. In an embodiment, the high rotation speed is higher than about 1,000 rotations-per-minute (RPM), and may be greater than about 2,000 RPM, so that the DPP on wafer 2 may be spun off quickly. The low-speed rotation following the high-speed rotation may have a rotation speed lower than about 500 RPM, and may be lower than about 200 RPM, in order to have a good rinse effect. Another high-speed rotation may then be performed to spin off the DI water, during which the spray of DI water may, or may not, be stopped. In an exemplary embodiment, the first rinse step may last about 20 seconds to about 1 minute, for example.

Figure 6:
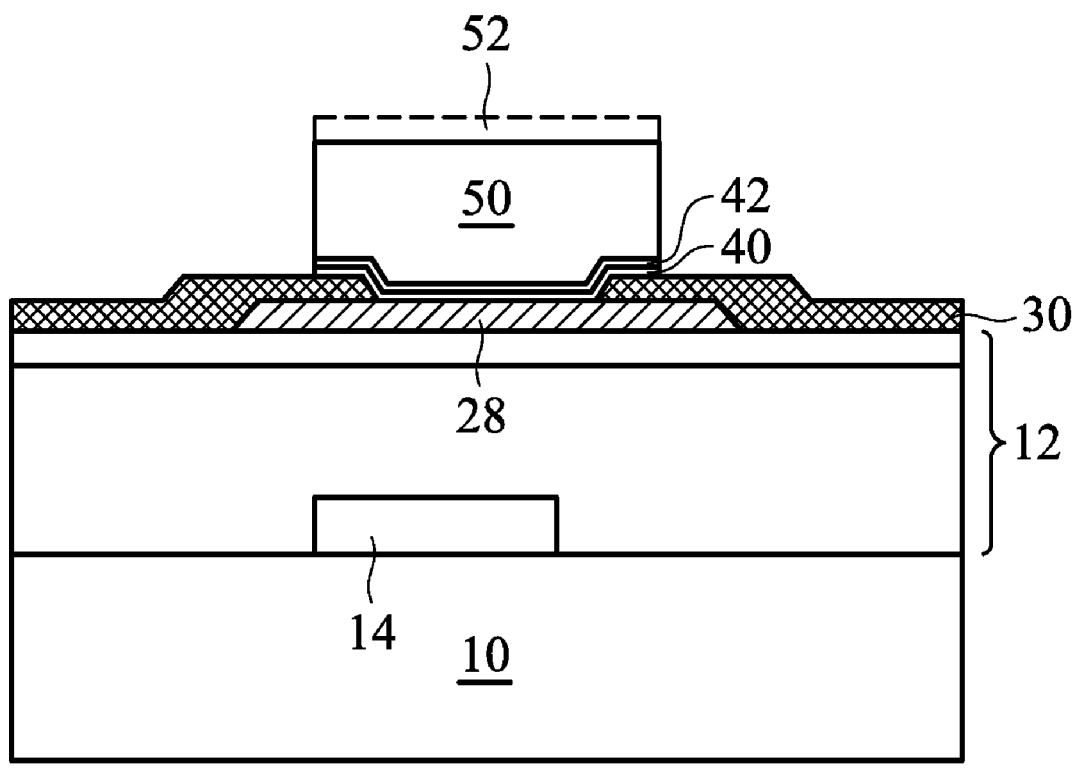

After the etch of copper seed layer 42, portions of barrier layer 40 are exposed. Referring to FIG. 6, the exposed portions of barrier layer 40 are removed using an HF solution. The concentration of the HF solution is low so that the process may be well controlled, and the undercut is reduced. In an exemplary embodiment, the concentration of HF in the HF solution is about 0.3 percent to about 3 percent. The reaction may be expressed as:

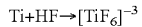  [Eq. 3]

FIG. 7 illustrates that chemical dispenser 65, which is used to dispense the HF solution, is also bundled in dispenser set 62. Similarly, DI water can also be dispensed through dispenser 66. In alternative embodiments, chemical dispenser 74 and DI water dispenser 76 are placed over wafer 2, wherein dispensers 74 and 76 are bundled together to form dispenser set 72. During the etching of barrier layer 40, dispenser set 62 or 72 swings back and forth (as symbolized by arrows 78) so that the HF solution may be sprayed through dispenser 65 or 74 onto wafer 2 uniformly. The duration of the etching may be between about 20 seconds and about 3 minutes, and may be between about 30 seconds and about 1 minute, for example.

The spray of the HF solution is then stopped, and the process is switched to a second rinse step, wherein DI water is sprayed onto wafer 2 to rinse wafer 2. The DI water is sprayed using dispenser 66 or 76, depending on whether the HF solution is sprayed using dispenser 65 or 74. A short switch time, which is the period of time starting from the spray of the HF solution is ended to the time the spray of DI water is started is used. In an embodiment, the switch time is less than about 1 second, less than about 0.5 seconds, or even less than about 0.3 seconds. Since dispensers 65 and 66 (or 74 and 76) are bundled in a same dispenser set, the DI water is dispensed to the same location where the HF solution was dispensed. Further, the short switch time ensures that the HF solution is quickly removed from over wafer 2. In an exemplary embodiment, during the second rinse step, wafer 2 keeps on spinning with the high-low-high rotation speed pattern, with the high rotation speeds being greater than about 1,000 RPM, or greater than about 2,000 RPM, and the low-speed rotation being lower than about 500 RPM, or lower than about 200 RPM, for example. In an exemplary embodiment, the second rinse step may last about 30 seconds to about 2 minute, or about 1 minute, for example.

By using the embodiments, due to the use of acidic etch for etching seed layer 42, the low-concentration HF solution for etching barrier layer 40, and the quick etch-to-rinse switching, the undercuts to barrier layer 40, if any, may be significantly reduced. In experiments, the undercut in the bump structure formed using conventional UBM etching processes were about 9 μm to about 10 μm. As a comparison, when the embodiments were used, the undercuts were reduced to between about 5 μm and about 6 μm, indicating a reduction in the size of undercuts by about 30 percent. Accordingly, the reliability of the metal bump formation process and the redistribution line formation process is significantly improved due to the reduced delamination caused by the undercuts.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a device, the method comprising:
   providing a wafer comprising a substrate;
   forming an under-bump metallurgy (UBM) layer comprising a barrier layer overlying the substrate and a seed layer overlying the barrier layer;
   forming a metal bump on a first portion of the UBM layer, wherein a second portion of the UBM layer is not covered by the metal bump and comprises a seed layer portion and a barrier layer portion;
   performing a first etch to remove the seed layer portion;
   performing a first rinse step on the wafer;
   performing a second etch to remove the barrier layer portion; and
   performing a second rinse step on the wafer, wherein at least a first switch time from the first etch to the first rinse step and a second switch time from the second etch to the second rinse step is less than about 1 second.

2. The method of claim 1, wherein the barrier layer comprises titanium, and the seed layer comprises copper.

3. The method of claim 1, wherein both the first switch time and the second switch time are less than about 1 second.

4. The method of claim 1, wherein the first etch is performed by dispensing an acidic etchant onto the wafer using a first dispenser, and the first rinse step is performed by dispensing di-ionized water onto the wafer using a second dispenser, and wherein the first and the second dispensers are bundled together, and are configured to swing back-and-forth over the wafer together.

5. The method of claim 4, wherein the second etch is performed by dispensing an HF solution onto the wafer using a third dispenser, and the second rinse step is performed by dispensing di-ionized water onto the wafer using the second dispenser, and wherein the first, the second, and the third dispensers are bundled together, and are configured to swing back-and-forth over the wafer together.

6. The method of claim 1, wherein at least one of the first and the second rinse steps comprises:
   rotating the wafer with a high rotation speed higher than about 1,000 rotations-per-minute (RPM);
   after the step of rotating the wafer with the high rotation speed, rotating the wafer with a low rotation speed lower than about 500 RPM; and
   after the step of rotating the wafer with the low rotation speed, rotating the wafer with an additional high rotation speed higher than about 1,000 RPM.

7. The method of claim 1, wherein the first etch is performed using an etchant comprising diluted phosphoric acid and hydrogen peroxide.

8. The method of claim 7, wherein the diluted phosphoric acid has a concentration between about 0.5 percent and about 5 percent, and wherein the hydrogen peroxide has a concentration between about 0.5 percent and about 5 percent.

9. The method of claim 1, wherein the second etch is performed using an HF solution with a concentration between about 0.3 percent and about 3 percent.

10. A method of forming a device, the method comprising:
    providing a wafer comprising a substrate;
    forming an under-bump metallurgy (UBM) layer comprising a barrier layer overlying the substrate and a seed layer overlying the barrier layer;
    forming a metal bump on a first portion of the UBM layer, wherein a second portion of the UBM layer is not covered by the metal bump, and comprises a seed layer portion and a barrier layer portion;
    placing a first dispenser and a second dispenser over the wafer, wherein the first and the second dispensers are bundled together, and are configured to swing over the wafer together;
    placing a third dispenser over the wafer, wherein the third dispenser is configured to swing over the wafer;
    using the first dispenser to dispense an acidic etchant onto the wafer to etch the seed layer portion;
    using the second dispenser to dispense di-ionized (DI) water onto the wafer;
    using the third dispenser to dispense an HF solution onto the wafer to etch the barrier layer portion; and
    dispensing DI water onto the wafer to clean the HF solution.

11. The method of claim 10, wherein at least one of a first switch time for switching from the step of using the first dispenser to the step of using the second dispenser and a second switch time for switching from the step of using the third dispenser to the step of dispensing DI water onto the wafer to clean the HF solution is less than about 0.5 second.

12. The method of claim 11, wherein both the first switch time and the second switch time are less than about 0.5 second.

13. The method of claim 10, wherein during the steps of etching the seed layer portion and using the second dispenser to dispense DI water, the first and the second dispensers set swing back-and-forth over the wafer, and wherein during the steps of etching the barrier layer portion and dispensing DI water onto the wafer to clean the HF solution, the third dispenser swings back-and-forth over the wafer.

14. The method of claim 10, wherein each of the step of using the second dispenser and the step of dispensing DI water onto the wafer to clean the HF solution comprises:
    rotating the wafer with a high rotation speed higher than about 1,000 rotations-per-minute (RPM);
    after the step of rotating the wafer with the high rotation speed, rotating the wafer with a low rotation speed lower than about 500 RPM; and
    after the step of rotating the wafer with the low rotation speed, rotating the wafer with an additional high rotation speed higher than about 1,000 RPM.

15. The method of claim 10, wherein the step of dispensing DI water onto the wafer to clean the HF solution is performed using the second dispenser, and wherein the first, the second, and the third dispensers are bounded together.

16. The method of claim 10, wherein the step of dispensing DI water onto the wafer to clean the HF solution is performed using a fourth dispenser different from the second dispenser, and wherein the third and the fourth dispensers are bounded together, and are configured to swing over the wafer together.

17. A method of forming a device, the method comprising:
forming a metal pad over a substrate;
forming a passivation layer over the metal pad;
forming a titanium barrier layer over the passivation layer and extending into an opening in the passivation layer to contact the metal pad;
forming a copper seed layer over the titanium barrier layer;
forming a mask over the copper seed layer, wherein the mask covers a first portion of the copper seed layer, and wherein a second portion of the copper seed layer is not covered by the mask;
performing a plating process to form a metal bump on the second portion of the copper seed layer;
removing the mask to expose the first portion of the copper seed layer;
performing an acidic etch to remove the first portion of the copper seed layer to expose a portion of the titanium barrier layer, wherein the acidic etch is performed using diluted phosphoric acid and hydrogen peroxide;
after the acidic etch, performing a first rinse step on the substrate, wherein a first switch time for switching from the acidic etch to the first rinse step is less than about 0.5 seconds;
performing an additional etch to remove the portion of the titanium barrier layer using an HF solution; and
after the additional etch, performing a second rinse step on the substrate, wherein a second switch time for switching from the additional etch to the second rinse step is less than about 0.5 seconds.

18. The method of claim 17, wherein the diluted phosphoric acid has a concentration between about 0.5 percent and about 5 percent, and the hydrogen peroxide has a concentration between about 0.5 percent and about 5 percent, and wherein the HF solution has a concentration between about 0.3 percent and about 3 percent.

19. The method of claim 17, wherein the step of performing the acidic etch and the first rinse step are performed using a first and a second dispenser to dispense the diluted phosphoric acid and di-ionized water, respectively, and wherein the step of performing the additional etch and the second rinse step are performed using a third and the second dispenser to dispense the HF solution and di-ionized water, respectively, and wherein the first, the second, and the third dispensers are bundled together.

* * * * *